United States Patent

Hayashi et al.

[11] Patent Number: 6,132,516
[45] Date of Patent: Oct. 17, 2000

[54] VACUUM DEPOSITION APPARATUS

[75] Inventors: Hiroshi Hayashi, Kanagawa; Shunji Amano, Saitama; Yasunori Kin, Miyagi, all of Japan

[73] Assignee: Sony Corporation, Tokyo, Japan

[21] Appl. No.: 09/289,438

[22] Filed: Apr. 9, 1999

[30]     Foreign Application Priority Data

Apr. 13, 1998 [JP] Japan .................................. 10-101282

[51] Int. Cl.⁷ ................................................. C23C 16/00
[52] U.S. Cl. ................. 118/718; 118/723 R; 204/298.03
[58] Field of Search .................... 118/718, 729, 118/723 R, 723 E, 723 I, 726; 204/298.24, 298.23; 432/250; 261/142

[56]             References Cited

U.S. PATENT DOCUMENTS 5,948,166   9/1999   David et al. ............................. 118/718

*Primary Examiner*—Shrive Beck
*Assistant Examiner*—Sylvia R. MacArthur
*Attorney, Agent, or Firm*—Hill & Simpson

[57]              ABSTRACT

Disclosed herein is a vacuum deposition apparatus including a vacuum chamber having an opening, a substrate to form a thin film thereon provided in the vacuum chamber, an evacuating device connected to the vacuum chamber for evacuating the vacuum chamber, a moving unit provided movably relative to the opening of the vacuum chamber, the moving unit having a cover for openably closing the opening of the vacuum chamber and a supporting member projecting from the cover, a reactor unit removably mounted on the supporting member of the moving unit for forming a thin film on the substrate in the condition where the reactor unit is moved into the vacuum chamber by the moving unit, and a positioning device provided in the vacuum chamber and having a retainer for separating the reactor unit from the supporting member of the moving unit and for retaining the rector unit with a given gap defined between the reactor unit and the substrate. With this configuration, a thin film can be accurately formed on the substrate, and the maintenance of the reactor unit can be easily carried out.

7 Claims, 10 Drawing Sheets

VACUUM DEPOSITION APPARATUS

RELATED APPLICATION DATA

The present application claims priority to Japanese Application No. P10-101282 filed Apr. 13, 1998 which application is incorporated herein by reference to the extent permitted by law.

BACKGROUND OF THE INVENTION

The present invention relates to an improvement in a vacuum deposition apparatus including a vacuum chamber, a substrate to form a thin film thereon provided in the vacuum chamber, and a reactor unit spaced a given distance from the substrate for forming a thin film on the substrate.

Such a vacuum deposition apparatus is used to form a thin film on a substrate by plasma chemical vapor deposition (plasma CVD), for example.

FIG. 11 shows a vacuum deposition apparatus in the related art. The vacuum deposition apparatus shown in FIG. 11 includes a vacuum chamber 1000. Provided in the vacuum chamber 1000 are a scan roll 1001, a supply roll 1002, a take-up roll 1003, a base 1004, an electrode 1005, a gas inlet pipe 1006, and a reactor 1007.

The electrode 1005 is provided in the reactor 1007, and a voltage is applied from a DC power supply 1009 to the electrode 1005, thereby forming a thin film on an elongated film-like substrate 1010 by plasma CVD. The substrate 1010 is supplied from the supply roll 1002, next wrapped around the scan roll 1001, and finally taken up by the take-up roll 1003. At this time, reactant gases are introduced from a reactant gas source (not shown) through the gas inlet pipe 1006 to the reactor 1007.

The reactor 1007 is supported to a gap adjusting stage 1011 fixed through the base 1004 to a floor surface or inner wall of the vacuum chamber 1000. The gap adjusting stage 1011 can accurately adjust the position of the reactor 1007 relative to the scan roll 1001 to maintain uniform a gap D between the rector 1007 and the scan roll 1001.

However, in carrying out maintenance work of the reactor 1007 such as cleaning of the inside of the reactor 1007, the rector 1007 must be demounted from the base 1004 and taken out of the vacuum chamber 1000. Such a work to remove a reactor for maintenance requires much time, so that it is undesirable to fix the reactor 1007 in the vacuum chamber 1000.

To cope with this problem, there has been proposed another vacuum deposition apparatus as shown in FIGS. 12 and 13.

This vacuum deposition apparatus employs a moving carriage 1020. A door 1031 for closing an opening 1033 of a vacuum chamber 1030 is mounted on the moving carriage 1020. A gas inlet pipe 1006 and a reactor 1007 are provided so as to be moved by the moving carriage 1020. The reactor 1007 is supported to supporting arms 1032 extending from the door 1031 into the vacuum chamber 1030. A gap adjusting stage 1011 is mounted on the supporting arms 1032 so as to adjust the position of the reactor 1007 relative to the scan roll 1001. With this configuration, the reactor 1007 set in the vacuum chamber 1030 can be easily taken out by moving the moving carriage 1020 in the direction of an arrow X2, thereby allowing easy maintenance of the reactor 1007 such as cleaning.

When the moving carriage 1020 is moved in the direction of an arrow X1 to close the opening 1033 of the vacuum chamber 1030 by means of the door 1031 and to evacuate the vacuum chamber 1030, an atmospheric pressure is applied to the door 1031, removing air from the vacuum chamber 1030 to cause a large warpage of the door 1031 inward of the vacuum chamber 1030 as shown in FIG. 13.

As a result, the position of the reactor 1007 set in the vacuum chamber 1030 is changed and the gap D formed between the substrate 1010 on the scan roll 1001 and the reactor 1007 is therefore changed, so that adjustment in position between the reactor 1007 and the substrate 1010 wrapped around the scan roll 1001 becomes very difficult. Accordingly, there occurs a problem that a thin film cannot be accurately formed on the substrate 1010 by plasma CVD.

SUMMARY OF THE INVENTION

It is accordingly an object of the present invention to provide a vacuum deposition apparatus which can accurately form a thin film on a substrate in a vacuum chamber and allows easy maintenance of a reactor or other functional parts form film deposition.

According to the present invention, there is provided a vacuum deposition apparatus comprising a vacuum chamber having an opening a substrate to form a thin film thereon provided in said vacuum chamber, an evacuating means connected to said vacuum chamber for evacuating said vacuum chamber, a moving unit provided movably relative to said opening of said vacuum chamber, said moving unit having a cover for openably closing said opening of said vacuum chamber and a supporting member projecting from said cover, a reactor unit removably mounted on said supporting member of said moving unit for forming a thin film on said substrate in the condition where said reactor unit is moved into said vacuum chamber by said moving unit, and a positioning means provided in said vacuum chamber and having a retainer for separating said reactor unit from said supporting member of said moving unit and for retaining said reactor unit with a given gap defined between said reactor unit and said substrate.

The opening of the vacuum chamber is openably closed by the cover, so that the reactor unit can be taken out of the vacuum chamber by moving the moving unit. Further, when the reactor unit is set in the vacuum chamber, the reactor unit is separated from the moving unit by the positioning means and retained by the positioning means with the given gap between the reactor unit and the substrate being maintained.

Accordingly, even when the cover is deformed by an atmospheric pressure after evacuating the vacuum chamber, the deformation of the cover has no influence upon the given gap between the reactor unit and the substrate.

Thus, the given gap between the reactor unit and the substrate can be maintained irrespective of deformation of the moving unit, thereby allowing accurate film deposition on the substrate. Furthermore, in carrying out maintenance of the reactor unit such as cleaning, the reactor unit can be taken out of the vacuum chamber by moving the moving unit, thereby allowing easy maintenance of the reactor unit.

Other objects and features of the invention will be more fully understood from the following detailed description and appended claims when taken with the accompanying drawings.

DETAILED DESCRIPTION OF THE PREFERRED EMBODIMENTS

Some preferred embodiments of the present invention will now be described in detail with reference to the attached drawings.

The following preferred embodiments to be hereinafter described are specific embodiments of the present invention, so various technical preferred limitations are included therein. However, the scope of the present invention is not limited to the preferred embodiments unless otherwise specified in the following description.

First Preferred Embodiment

Figure 1:
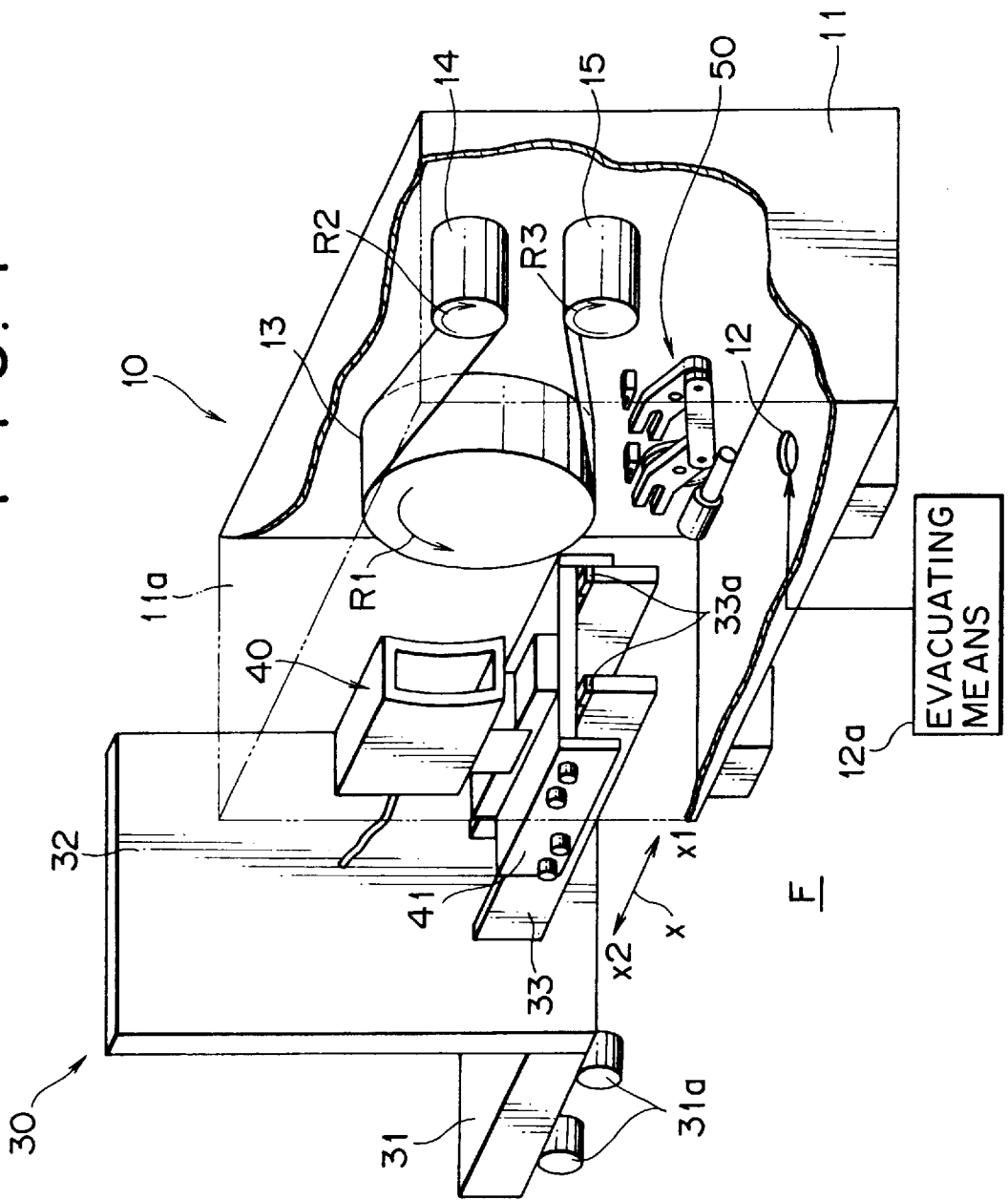
FIG. 1 is a partially cutaway perspective view of a vacuum deposition apparatus according to a preferred embodiment of the present invention in the condition where a cover is closed for the purpose of maintenance.
Figure 5:
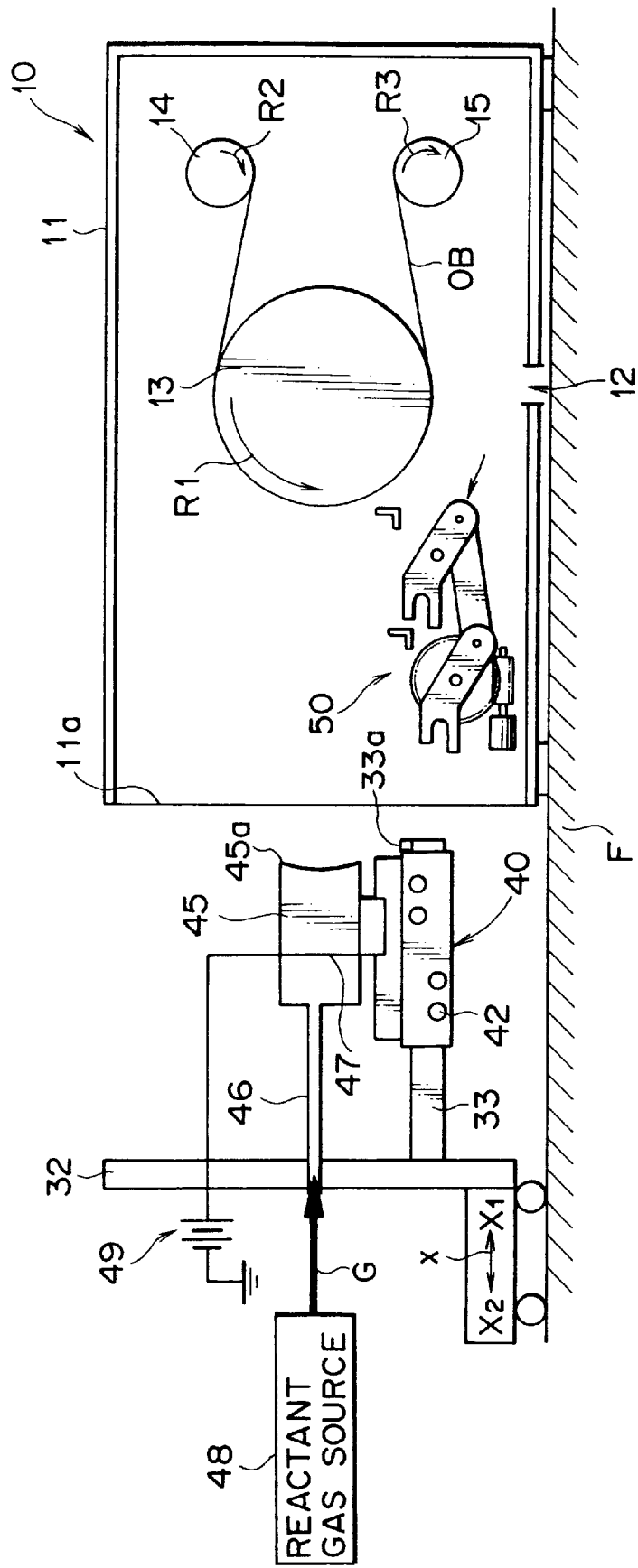
FIG. 5 is a side view of the vacuum deposition apparatus shown in FIG. 1.

FIG. 1 is a partially cutaway perspective view of a vacuum deposition apparatus 10 according to a first preferred embodiment of the present invention, and FIG. 5 is a side view of the vacuum deposition apparatus 10 shown in FIG. 1. The vacuum deposition apparatus 10 will now be described in detail with reference to FIGS. 1 and 5.

The vacuum deposition apparatus 10 includes a boxlike vacuum chamber 11 formed of metal. The bottom surface of the vacuum chamber 11 is formed with a gas outlet 12 for exhausting air from the vacuum chamber 11. The gas outlet 12 is connected to an evacuating means 12a. One end surface of the vacuum chamber 11 is formed with an opening 11a adapted to be closed by a cover 32 to be hereinafter described.

Provided in the vacuum chamber 11 are a scan roll 13, a supply roll 14, a take-up roll 15, and a positioning means 50. An elongated film-like substrate OB on which a thin film is to be formed is preliminarily wound around the supply roll 14. The substrate OB supplied from the supply roll 14 is wrapped about 180° around the scan roll 13, and the substrate OB on which the thin film has been formed is finally wound around the take-up roll 15. The substrate OB is guided by guide rolls (not shown) during feeding from the supply roll 14 to the take-up roll 15. The supply roll 14 and the take-up roll 15 are rotated in the directions of arrows R2 and R3, respectively, by motors (not shown) to supply and wind the substrate OB. During rotation of the supply roll 14 and the take-up roll 15, the scan roll 13 is also rotated in the direction of arrow R1.

The vacuum deposition apparatus 10 further includes a moving unit 30. The moving unit 30 will now be described in detail with reference to FIG. 1.

The moving unit 30 has a carriage 31, a cover (door) 32, a pair of supporting bars 33, and a reactor unit 40. The carriage 31 is provided with a plurality of tire wheels 31a for allowing horizontal movement of the carriage 31 on a floor F in the opposite directions depicted by a double-headed arrow X. The cover 32 is supported to a front end of the carriage 31 and extends vertically upward therefrom, so that the cover 32 is movable with the carriage 31 in the opposite directions of the arrow X. The supporting bars 33 extend horizontally in parallel, and each of the supporting bars 33 is fixed at one end thereof to the cover 32 in a cantilever fashion. The reactor unit 40 is removably mounted on the supporting bars 33. A stopper 33a is provided near the other end of each supporting bar 33 to prevent falling of the reactor unit 40 from the supporting bars 33.

When the carriage 31 of the moving unit 30 is moved in the direction X1, the cover 32 is also moved in the same direction to close the opening 11a of the vacuum chamber 11, and the reactor unit 40 is also moved in the same direction to enter the vacuum chamber 11. Conversely, when the carriage 31 is moved in the direction X2 opposite to the direction X1, the cover 32 is also moved in the same direction to open the opening 11a, and the reactor unit 40 in the vacuum chamber 11 is also moved in the same direction to get out of the vacuum chamber 11.

Figure 2:
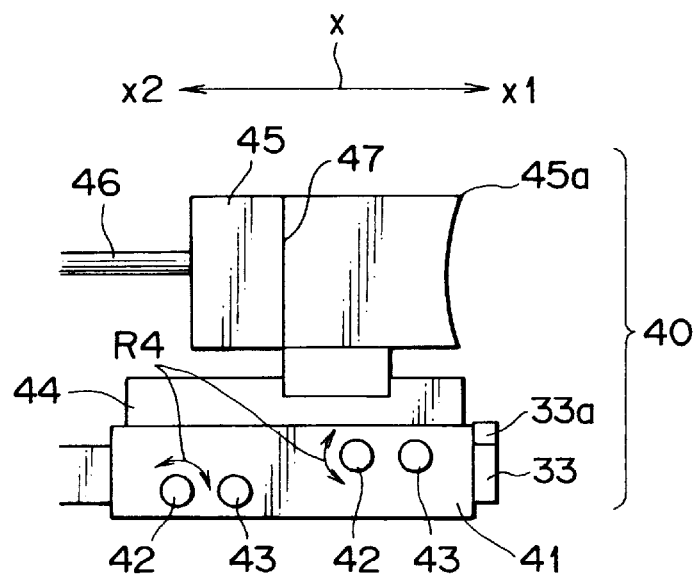
FIG. 2 is an enlarged side view of a reactor unit in the vacuum deposition apparatus shown in FIG. 1.

FIG. 2 is an enlarged side view of the reactor unit 40 shown in FIG. 1. The reactor unit 40 will now be described in detail with reference to FIGS. 1, 2, and 5. As shown in FIG. 2, the reactor unit 40 includes an invertedly U-shaped base plate 41, a plurality of engaging members 42 and 43, a gap adjusting stage 44, a reactor 45, a gas inlet pipe 46, and an electrode 47. The base plate 41 is removably mounted on the supporting bars 33.

The plurality of engaging members 42 and 43 project from the opposite side surfaces of the base plate 41 in such a manner that two pairs of engaging members 42 and 43 are arranged on each side surface of the base plate 41. In each pair, the engaging member 42 is a rotatable engaging member, and the engaging member 43 is a fixed engaging member.

Each rotatable engaging member 42 is rotatable in the opposite directions of a double-headed arrow R4 as shown in FIG. 2. The rotatable engaging members 42 projecting from each side surface of the base plate 41 are adapted to engage first retainers 51 and 52 of the positioning means 50 to be hereinafter described. When the rotatable engaging members 42 come into engagement with the first retainers 51 and 52, the first retainers 51 and 52 are pivotally moved to rotate the rotatable engaging members 42 and to lift off the reactor unit 40 from the supporting bars 33. At this time, the fixed engaging members 43 projecting from each side surface of the base plate 41 come into engagement with second retainers 57 of the positioning means 50 to be hereinafter described. Thus, the reactor unit 40 is reliably retained and positioned in the vacuum chamber 11 by the first retainers 51 and 52 and the second retainers 57 of the positioning means 50.

Figure 6:
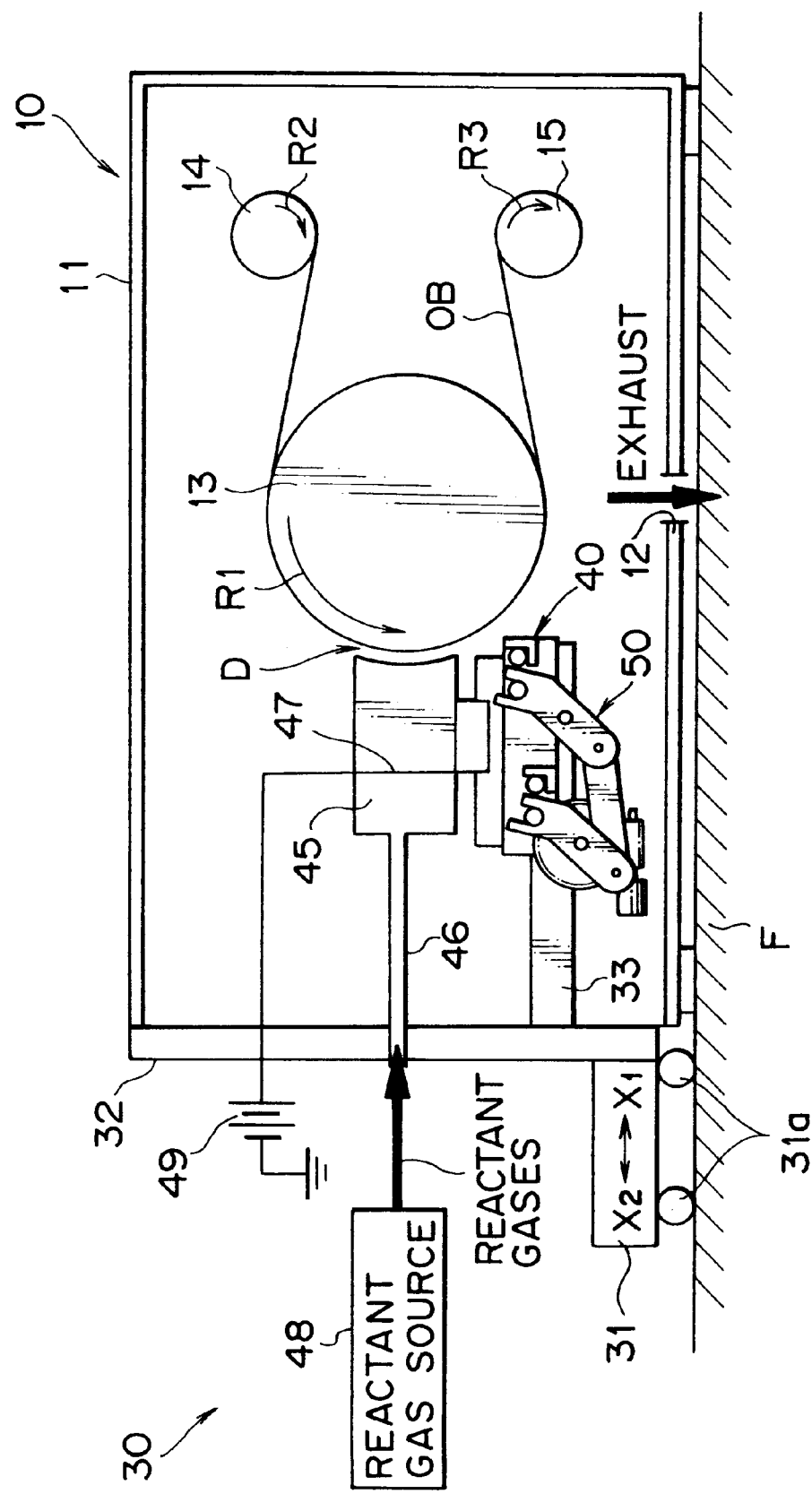
FIG. 6 is a side view of the vacuum deposition apparatus according to a first preferred embodiment of the present invention in the condition where the cover is closed.

The gap adjusting stage 44 is mounted on the base plate 41, and the reactor 45 is mounted on the gap adjusting stage 44. The reactor 45 is a rectangular cylindrical member formed of glass, plastic, ceramic, metal, etc. The reactor 45 has an arcuate front open end 45a corresponding to the outer circumference of the scan roll 13. The gap adjusting stage 44 is provided with a motor, ball screw, guide, etc. (not shown) to finely move the reactor 45 in the opposite directions of the arrow X, thereby effecting fine adjustment of the position of the reactor 45 relative to the scan roll 13 to adjust a gap D between the reactor 45 and the scan roll 13 (see FIG. 6).

The gas inlet pipe 46 is formed of a nonmetallic material. One end of the gas inlet pipe 46 is connected to a rear closed end of the reactor 45, and the other end of the gas inlet pipe 46 is connected to a reactant gas source 48 as shown in FIG. 5. The reactant gas source 48 serves to supply reactant gases G through the gas inlet pipe 46 to the reactor 45. Examples of the reactant gases G include silanes (e.g., $SiH_4$), fluorides (e.g., $SiF_4$), and hydrocarbons (e.g., $CH_4$).

The electrode 47 is formed of metal, and it is in the form of mesh. The electrode 47 is built in the reactor 45 to perform thin film formation by plasma chemical vapor deposition (plasma CVD). A power supply 49 is electrically connected to the electrode 47. The power supply 49 is a DC power supply, for example, for supplying a supply voltage to the electrode 47.

Figure 3:
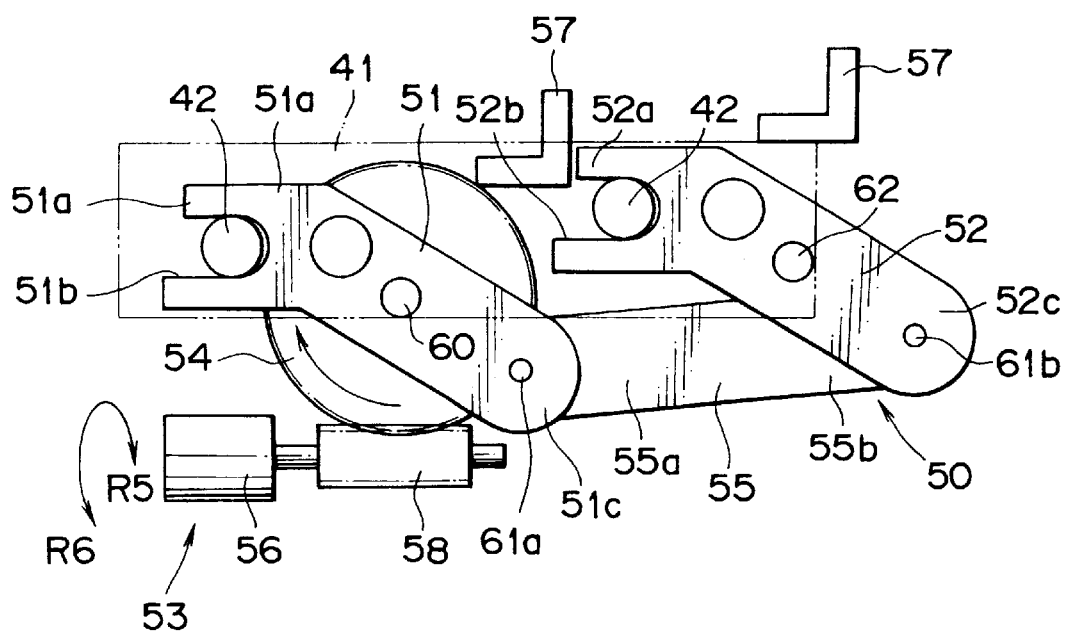
FIG. 3 is an enlarged side view of a positioning means in the vacuum deposition apparatus shown in FIG. 1.
Figure 4:
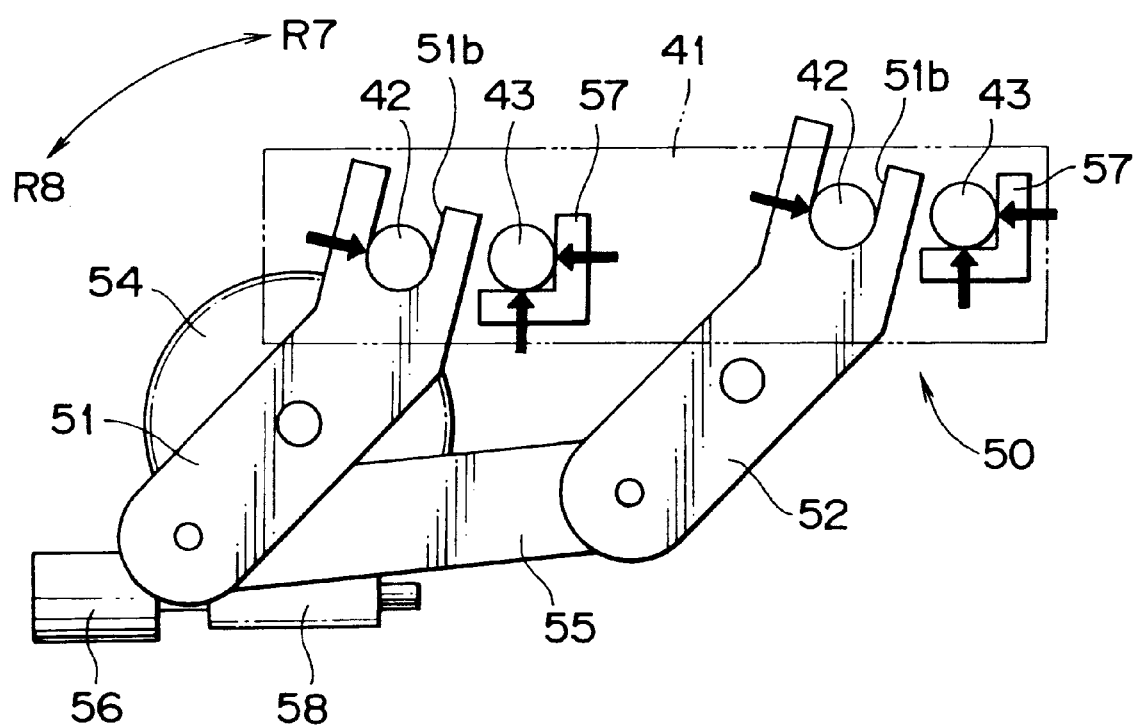
FIG. 4 is a view similar to FIG. 3, showing a lifted condition of the reactor unit.

FIGS. 3 and 4 are enlarged side views of the positioning means 50 in different conditions. The positioning means 50 will now be described in detail with reference to FIGS. 1, 3, and 4. The positioning means 50 is provided on each side surface of the vacuum chamber 11. Each positioning means 50 includes two first retainers 51 and 52 for retaining the rotatable engaging members 42, a link 55 for pivotally connecting the first retainers 51 and 52, two second retainers 57 for retaining the fixed engaging members 43, and a swaying means 53 for pivotably driving the first retainer 51.

The first retainer 51 is an elongated plate member having one end 51a formed with a recess 51b for engaging one of the rotatable engaging members 42. The first retainer 51 is pivotably connected at its other end 51c to one end 55a of the link 55 by a joint shaft 61a. The first retainer 51 is fixed to a first shaft 60 rotatably supported to each side surface of the vacuum chamber 11.

Similarly, the other first retainer 52 is an elongated plate member having one end 52a formed with a recess 52b for engaging the other rotatable engaging member 42. The first retainer 52 is pivotably connected at its other end 52c to the other end 55b of the link 55 by a joint shaft 61b. The first retainer 52 is fixed to a second shaft 62 rotatably supported to each side surface of the vacuum chamber 11. Further, the second retainers 57 are provided on each side surface of the vacuum chamber 11 to retain the fixed engaging members 43.

The swaying means 33 will now be described in detail with reference to FIGS. 3 and 4. The swaying means 53 includes a worm wheel 54, a motor 56, and a worm 58. The worm wheel 54 is fixed to the first shaft 60, and is mechanically connected to the worm 58. The worm 58 is mechanically connected to the motor 56, and can be rotated in the opposite directions of arrows R5 and R6 by the motor 56.

When the motor 56 is operated to rotate the worm 58 in the direction of the arrow R5 in the condition that the rotatable engaging members 42 are engaged with the first retainers 51 and 52, the worm wheel 54 is rotated in the direction of an arrow R7 shown in FIG. 4. Accordingly, the first shaft 60 fixed to the worm wheel 54 is synchronously rotated in the same direction, and the first retainer 51 fixed to the first shaft 60 is synchronously pivoted in the direction of the arrow R7. Further, the first retainer 52 pivotally connected through the link 55 to the first retainer 51 is synchronously pivoted in the direction of the arrow R7 until the fixed engaging members 43 come into engagement with the second retainers 57. In this condition, the rotatable engaging members 42 and the fixed engaging members 43 of the reactor unit 40 are retained by the first retainers 51 and 52 and the second retainers 57 of the positioning means 50, respectively. Conversely, when the motor 56 is rotated in the direction of the arrow R6 in the condition shown in FIG. 4, the first retainers 51 and 52 are pivoted in the direction of an arrow R8 shown in FIG. 4 until the condition shown in FIG. 3 is reached.

The operation of the vacuum deposition apparatus mentioned above will now be described with reference to FIGS. 1 to 6.

FIG. 1 shows a condition that the reactor 45 is taken out of the vacuum chamber 11 for the purpose of maintenance. In this condition, the carriage 31 is separated from the vacuum chamber 11 to draw the reactor unit 40 carried on the supporting bars 33 out of the vacuum chamber 11, thereby allowing an operator to easily carry out the maintenance of the reactor 45 such as cleaning and replacement.

In performing thin film formation on the substrate OB in the vacuum chamber 11, the carriage 31 of the moving unit 30 is moved by the operator in the direction X1 to put the reactor unit 40 into the vacuum chamber 11. At this time, the rotatable engaging members 42 of the base plate 41 of the reactor unit 40 are engaged into the recesses 51b and 52b of the first retainers 51 and 52 as shown in FIG. 3. In this condition, the opening 11a of the vacuum chamber 11 is closed by the cover 32. By operating the motor 56 in this condition, the base plate 41 of the reactor unit 40 is lifted from the supporting bars 33 by the first retainers 51 and 52 and positioned by the second retainers 57. Thus, the reactor unit 40 is positioned separately from the supporting bars 33 in such a manner that the rotatable engaging members 42 are retained by the first retainers 51 and 52 and the fixed engaging members 43 are retained by the second retainers 57.

Since the reactor unit 40 is separated from the supporting bars 33 in the above condition, the position of the reactor unit 40 is not dependent upon the movement of the supporting bars 33 and the cover 32. Accordingly, the gap D between the reactor 45 and the scan roll 13 can be kept constant to form a uniform thin film on the substrate OB by plasma CVD. That is, since the front open end 45a of the reactor 45 is so arcuate as to correspond to the outer circumference of the scan roll 13, the gap D can be made uniform.

When the air in the vacuum chamber 11 is removed from the gas outlet 12 by the evacuating means 12a to reach a vacuum condition (e.g., about 0.1 Pa) of the vacuum chamber 11, the reactant gases G are supplied from the reactant gas source 48 through the gas inlet pipe 46 into the reactor 45. At this time, a voltage (e.g., 0.5 kV to 3 kV) is applied from the DC power supply 49 to the electrode 47. In this voltage applied condition, the substrate OB is fed in the direction of the arrow R1 to thereby perform film deposition on the substrate OB by plasma CVD.

In the condition that the vacuum chamber 11 is evacuated and an atmospheric pressure is applied to the cover 32, there is a possibility that the cover 32 may be warped inward of the vacuum chamber 11 at the opening 11a. Even in this condition, however, the reactor unit 40 remains still regardless of movement of the supporting bars 33 due to the warpage of the cover 32, because the reactor unit 40 is separated from the supporting bars 33 by the positioning means 50 provided on the inside surfaces of the vacuum chamber 11. Therefore, the gap D between the reactor 45 and the scan roll 13 can be maintained at a uniform distance originally adjusted.

During the film deposition to the substrate OB, the inner wall surface of the reactor 45 may be contaminated by undue depositions. The depositions on the inner wall surface of the reactor 45 are removed after the film deposition to the substrate OB. That is, the motor 56 is operated in the condition shown in FIG. 6 to pivot the first retainers 51 and 52 in the direction of the arrow R8 shown in FIG. 4 until the reactor unit 40 is lowered to be placed on the supporting bars 33. Thereafter, the atmospheric air is introduced into the vacuum chamber 11, and the carriage 31 of the moving unit 30 is moved in the direction X2 as shown in FIG. 5 to remove the reactor unit 40 from the vacuum chamber 11.

According to the preferred embodiment mentioned above, the position of the reactor 45 relative to the scan roll 13 during the film deposition can be maintained regardless of a change in position of the supporting bas 33 due to warpage of the cover 32 by the atmospheric pressure after evacuation of the vacuum chamber 11. Accordingly, the gap D between the reactor 45 and the scan roll 13 can be accurately maintained at a given distance. As a result, the accuracy of thin film deposition to the substrate OB in the vacuum chamber 11 can be greatly improved. Moreover, in performing the maintenance of the reactor 45, the reactor 45 can be taken out of the vacuum chamber 11 by moving the moving unit 30, so that the associated work for the maintenance in the related at can be reduced to thereby improve the productivity of vacuum deposition.

FIGS. 7 to 10 show other preferred embodiments of the present invention.

The preferred embodiments shown in FIGS. 7 to 10 are substantially similar in structure to the first preferred embodiment shown in FIG. 1. Accordingly, substantially the same parts in the following preferred embodiments as those of the first preferred embodiment are denoted by the same reference numerals, and the description thereof will be omitted herein.

Second Preferred Embodiment

Figure 7:
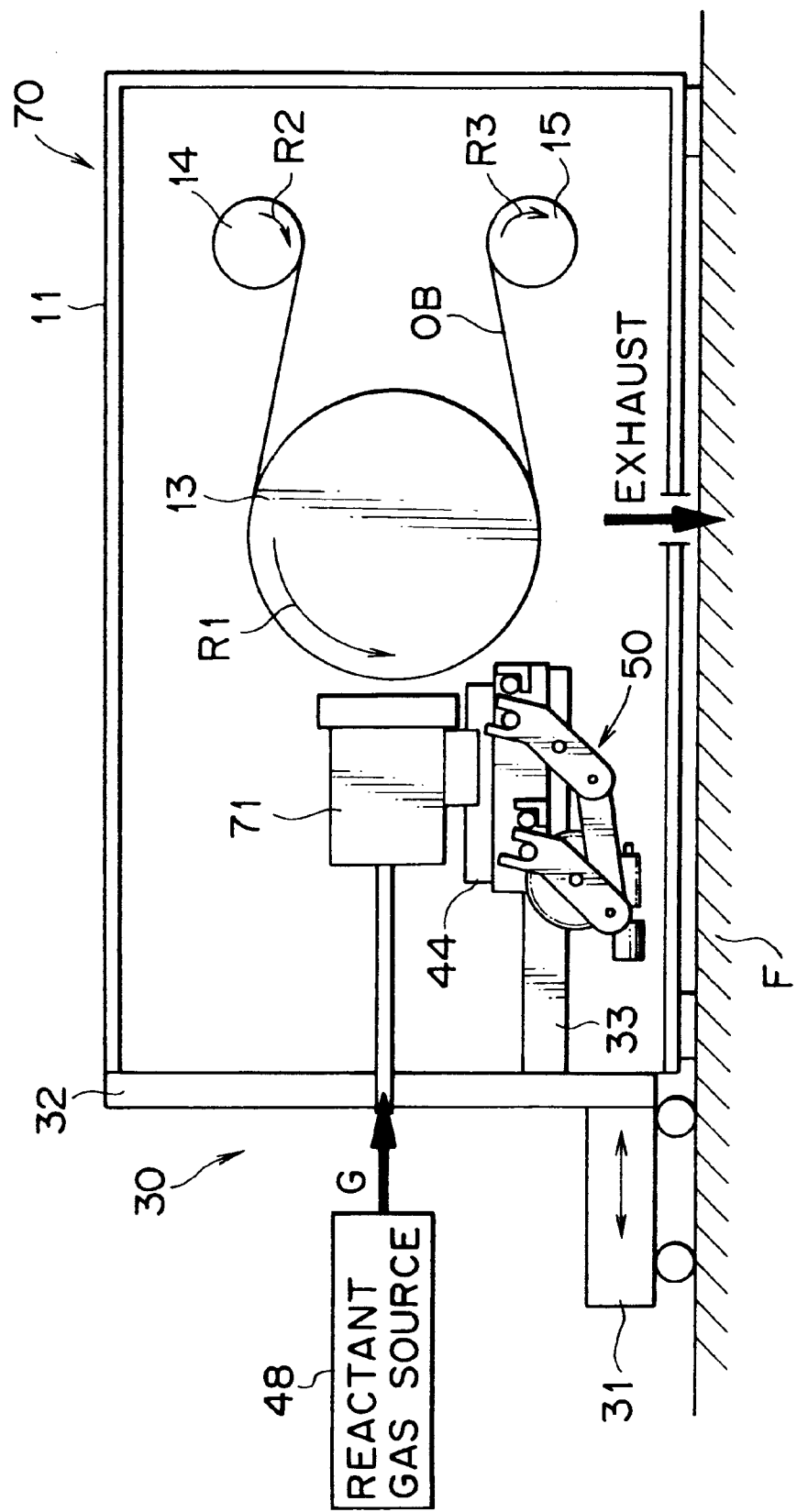
FIG. 7 is a side view of a vacuum deposition apparatus according to a second preferred embodiment of the present invention.

FIG. 7 shows a vacuum deposition apparatus 70 according to a second preferred embodiment of the present invention. In contrast with the first preferred embodiment wherein the reactor unit 40 has the reactor 45 for performing plasma CVD, the second preferred embodiment employs a sputtering cathode 71 in place of the reactor 45. The sputtering cathode 71 is mounted on a gap adjusting stage 44. The other configuration is similar to that of the first preferred embodiment. By using the sputtering cathode 71, a thin film can be formed on a substrate OB by sputtering. In other words, the vacuum deposition apparatus 70 shown in FIG. 7 can be used as a sputtering apparatus.

Third Preferred Embodiment

Figure 8:
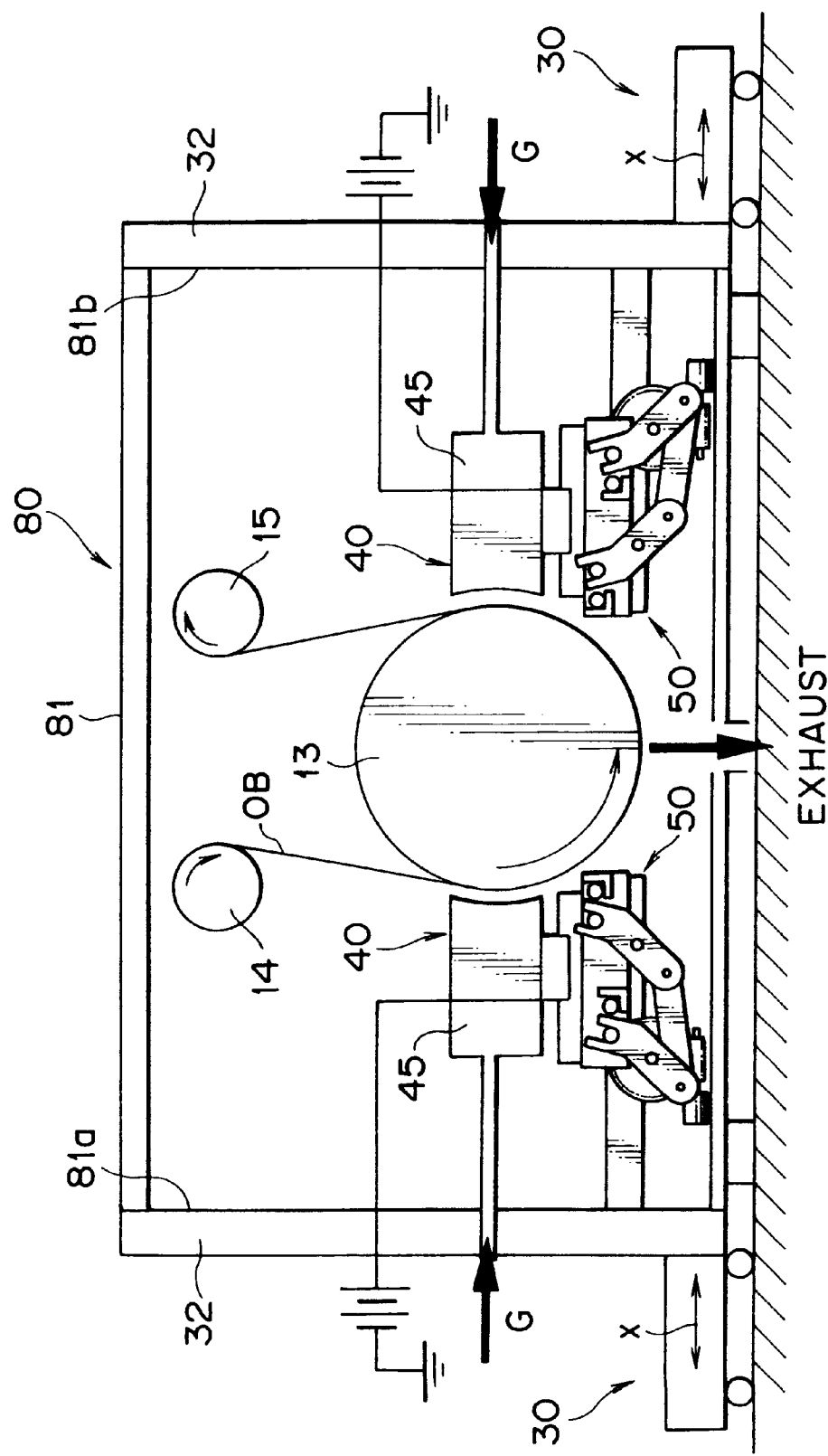
FIG. 8 is a side view of a vacuum deposition apparatus according to a third preferred embodiment of the present invention.

FIG. 8 shows a vacuum deposition apparatus 80 of the FIG. 8 according to a third preferred embodiment of the present invention. The vacuum deposition apparatus 80 shown in FIG. 8 is different from the vacuum deposition apparatus 10 shown in FIG. 1 in the point that the former has two moving units and two reactor units.

More specifically, the vacuum deposition apparatus 80 of FIG. 8 has two moving units 30 and two reactor units 40 respectively mounted on the two moving units 30. The vacuum deposition apparatus 80 further has a vacuum chamber 81 formed with two openings 81a and 81b opposed to each other. The two openings 81a and 81b are openably closed by two covers 32, respectively. In correspondence thereto, two pairs of positioning means 50 are provided to respectively position the two reactor units 40 separately from two pairs of supporting bars 33. Further, a supply roll 14 and a take-up roll 15 are located above a scan roll 13. Two reactors 45 are located 180° apart from each other with respect to the scan roll 13.

With this configuration, a deposition rate of a thin film onto the substrate OB can be increased to thereby improve the productivity.

Fourth Preferred Embodiment

Figure 9:
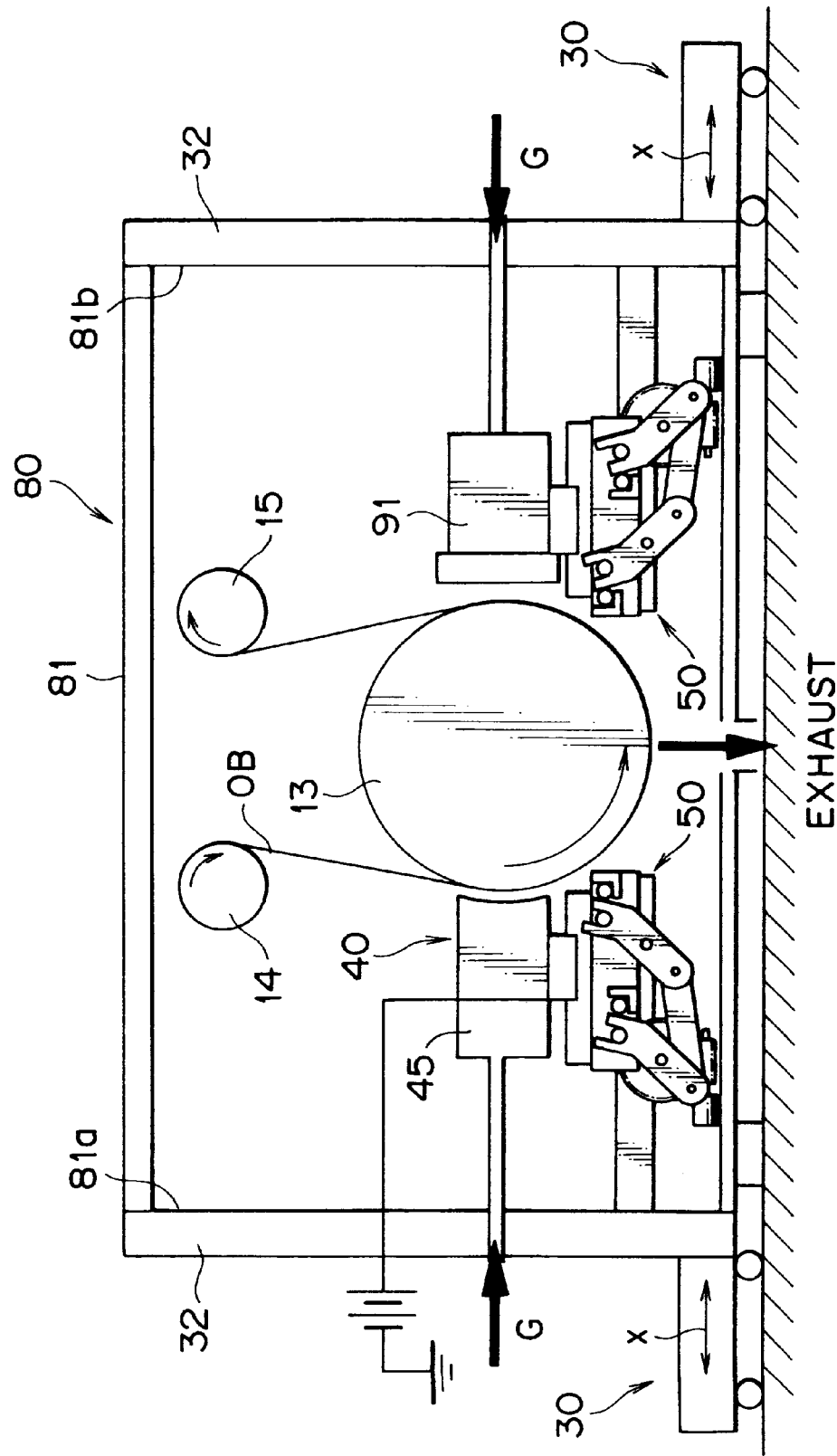
FIG. 9 is a side view of a vacuum deposition apparatus according to a fourth preferred embodiment of the present invention.
Figure 10:
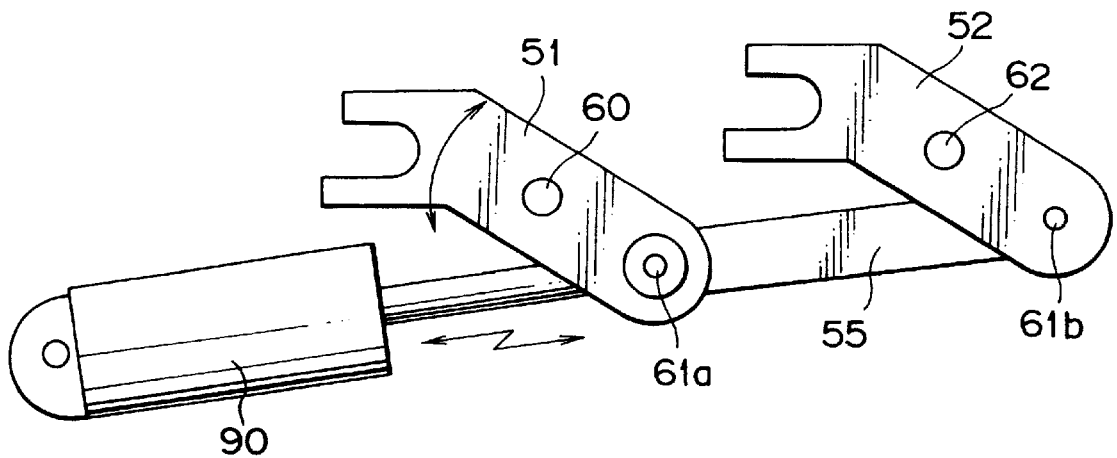
FIG. 10 is an enlarged side view showing a modification of the positioning means in the vacuum deposition apparatus shown in FIG. 1.
Figure 11:
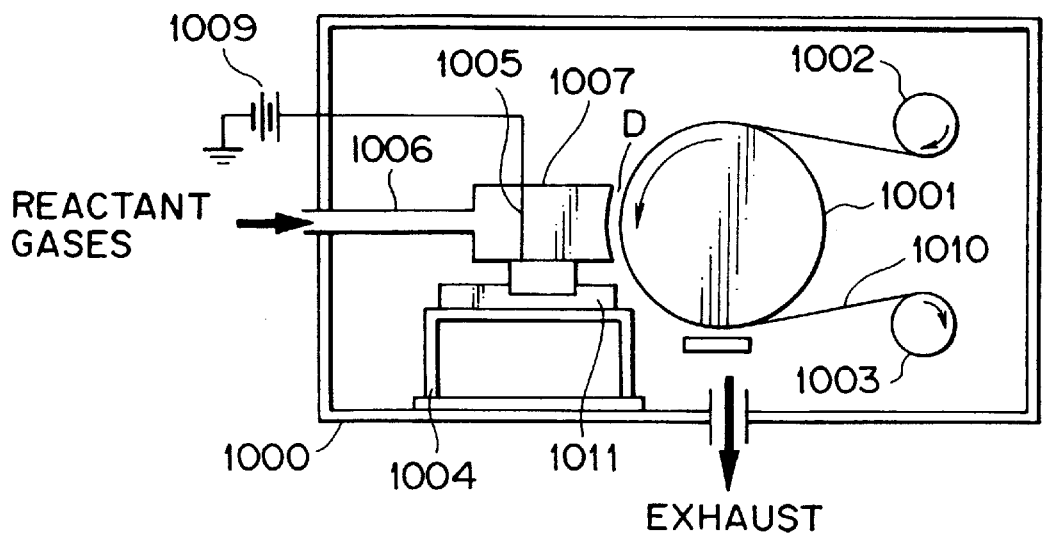
FIG. 11 is a side view of a vacuum deposition apparatus in the related art.
Figure 12:
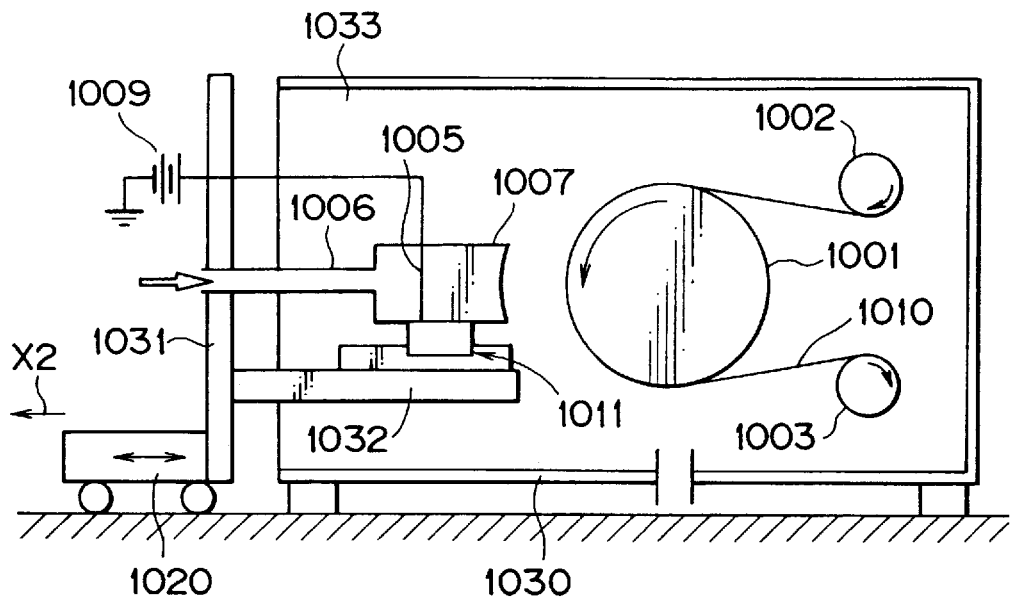
FIG. 12 is a side view of another vacuum deposition apparatus in the related art.
Figure 13:
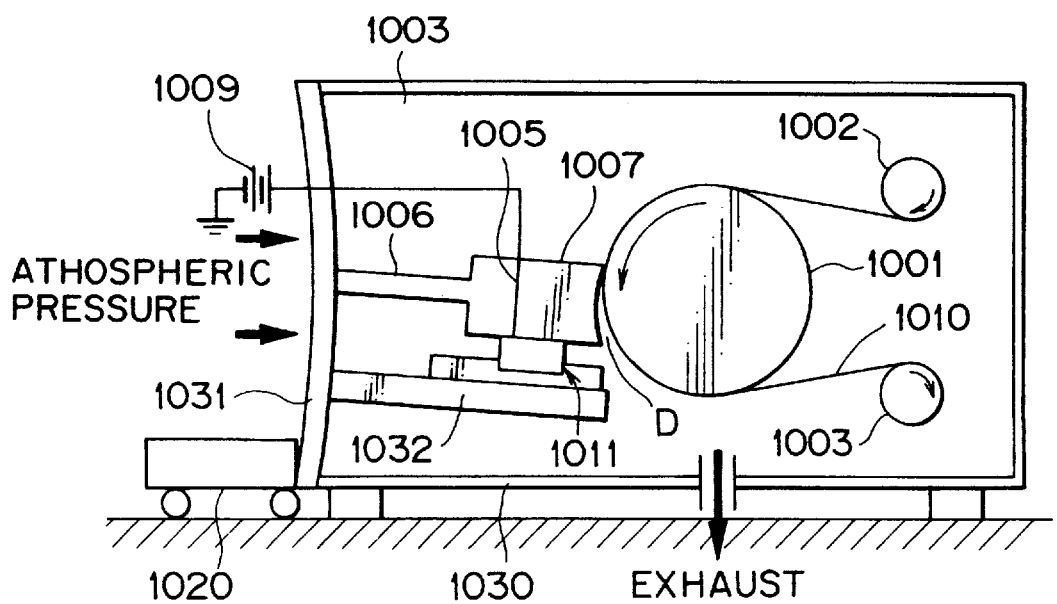
FIG. 13 is a view similar to FIG. 12, illustrating a problem in the related art.

FIG. 9 shows a vacuum deposition apparatus 80' according to a fourth preferred embodiment of the present invention. The vacuum deposition apparatus 80' shown in FIG. 9 is different from the vacuum deposition apparatus 80 shown in FIG. 8 in the point that an ion source 91 is substituted for one of the two reactors 45 of the vacuum deposition apparatus 80. With this configuration, a deposition rate of a thin film onto a substrate OB can be increased to thereby improve the productivity.

It should be noted that the present invention is not limited to the above preferred embodiments.

For example, while the vacuum deposition apparatus according to each of the preferred embodiments mentioned above is designed to perform plasma CVD or sputtering, the present invention is applicable to a vacuum deposition apparatus designed to perform any other processes for film deposition. That is, the vacuum deposition apparatus of the present invention is effective to any apparatus required to carry out both maintenance such as cleaning and precise positioning of a reactor unit including a reactor or cathode relative to a substrate OB on which a thin film is to be formed.

While the rotatable engaging members 42 are used in each of the above preferred embodiments, they may be replaced by fixed engaging members similar to the fixed engaging members 43. Further, two pairs of rotatable engaging members 42 and fixed engaging members 43 are provided on each side surface of the base plate 41 in each of the above preferred embodiments, two or more pairs of rotatable engaging members 42 and fixed engaging members 43 may be provided to improve the stability of the reactor unit 40.

Further, while the single reactor 45 is mounted on the moving unit 30 in each of the above preferred embodiments, a plurality of reactors 45 may be mounted on the moving unit 30. Additionally, while the positioning means 50 is pivotally driven by the motor 56 to move the reactor unit 40 in each of the above preferred embodiments, a cylinder 90 shown in FIG. 10 may be used instead as the driving means.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A vacuum deposition apparatus comprising:
    a vacuum chamber having an opening;
    a substrate for forming thin film thereon provided in said vacuum chamber;
    an evacuating means connected to said vacuum chamber for evacuating said vacuum chamber;
    a moving unit provided movably relative to said opening of said vacuum chamber, said moving unit having a cover for opening and closing said opening of said vacuum chamber and a supporting member projecting from said cover;
    a reactor unit removably mounted on said supporting member of said moving unit for forming a thin film on said substrate in the condition where said reactor unit is moved into said vacuum chamber by said moving unit; and a positioning means provided in said vacuum chamber and having a retainer for separating said reactor unit from said supporting member of said moving unit and for retaining said reactor unit with a given gap defined between said reactor unit and said substrate.

2. A vacuum deposition apparatus according to claim 1, wherein said reactor unit has an engaging member for engaging said retainer of said positioning means, so that said reactor unit is retained separately from said supporting member of said moving unit by engagement of said engaging member with said retainer.

3. A vacuum deposition apparatus according to claim 1, wherein said reactor unit comprises a base plate removably mounted on said supporting member of said moving unit, a rotatable engaging member rotatably provided on said base plate, and a fixed engaging member fixed to said base plate.

4. A vacuum deposition apparatus according to claim 3, wherein said retainer of said positioning means comprises a first retainer for retaining said rotatable engaging member and a second retainer for retaining said fixed engaging member, and said positioning means further has a driving means connected to said first retainer for pivotally driving said first retainer.

5. A vacuum deposition apparatus according to claim 4, wherein said first retainer has a recess for engaging said rotatable engaging member, so that when said first retainer is pivotally driven by said driving means in the condition where said rotatable engaging member is engaged with said recess, said reactor unit is separated from said supporting member of said moving unit, and said rotatable engaging member and said fixed engaging member are retained by said first retainer and said second retainer, respectively.

6. A vacuum deposition apparatus according to claim 1, wherein said reactor unit has a reactor for forming a thin film by plasma chemical vapor deposition.

7. A vacuum deposition apparatus according to claim 1, wherein said reactor unit has a sputtering cathode for forming a thin film by sputtering.

* * * * *